United States Patent [19]

Iwasaki et al.

[11] Patent Number: 4,677,623

[45] Date of Patent: Jun. 30, 1987

[54] DECODING METHOD AND APPARATUS FOR CYCLIC CODES

[75] Inventors: Kazuhiko Iwasaki, Kokubunji; Junichi Tatezaki, Kodaira; Tsuneo Funabashi, Tokyo, all of Japan

[73] Assignee: Hitachi, Ltd., Tokyo, Japan

[21] Appl. No.: 669,423

[22] Filed: Nov. 8, 1984

[30] Foreign Application Priority Data

Nov. 11, 1983 [JP] Japan .............................. 58-210855
May 25, 1984 [JP] Japan .............................. 59-104541

[51] Int. Cl.$^4$ .............................................. G06F 11/10
[52] U.S. Cl. .......................................... 371/40; 371/39
[58] Field of Search ............................... 371/37, 39, 40

[56] References Cited

U.S. PATENT DOCUMENTS

| | | | |
|---|---|---|---|
| 3,159,810 | 12/1964 | Fire ......................... | 371/40 |
| 4,151,510 | 4/1979 | Howell et al. ............... | 371/40 |
| 4,377,863 | 3/1983 | Legory et al. ................ | 371/42 |
| 4,486,881 | 12/1984 | de Couasnon .................. | 371/40 X |
| 4,498,178 | 2/1985 | Ohhashi ...................... | 371/37 |

OTHER PUBLICATIONS

S. Lin et al., Error Control Coding: Fundamentals and Applications, Prentice-Hall, Inc., Englewood Cliffs, N.J., pp. 257–269.

*Primary Examiner*—Charles E. Atkinson
*Attorney, Agent, or Firm*—Antonelli, Terry & Wands

[57] ABSTRACT

In an apparatus for decoding cyclic codes generated by a generator polynomial $$G(x) = (x_c + 1) \prod_{i=1}^{l} P_i(x)$$

(where $P_i(x)$ is a $m_i$-order irreducible polynomial) including 0-th to l-th feedback shift registers corresponding to the terms $(x^c+1)$ and $P_i(x)$, a coincidence circuit for detecting coincidence of a predetermined number of low order bits of said 0-th to l-th feedback shift registers and all-zero conditions of a high order bits, the predetermined number being a minimum one of numbers of bits (c, $m_1$, $m_2$, ... $m_l$) of the feedback shift register, the 0-th feedback shift register having an output terminal thereof connected to an input terminal thereof, and the 1st to l-th feedback shift registers each having an output terminal thereof connected to an input terminal thereof and having exclusive OR gates inserted between stages determined by the associated simple polynomial, exclusive OR gates each receiving the output of the associated feedback shift register as one input thereto; a method for decoding the cyclic code for correcting a burst error by shifting the 0-th to l-th feedback shift registers until the coincidence circuit detects the coincidence, comprising the steps of; shifting at least one of said 0-th to l-th feedback shift registers a predetermined number of times; and simultaneously shifting the 0-th to l-th feedback shift registers after the predetermined number of shifting until the coincidence circuit detects the coincidence.

7 Claims, 15 Drawing Figures

FIG. 5

| RL | $\mu_C$ | $\mu_1$ | $\mu_2$ | $\mu_3$ |
|---|---|---|---|---|
| 128 | 9 | 0 | 0 | 16 |
| 256 | 20 | 9 | 0 | 3 |
| 512 | 19 | 3 | 0 | 3 |
| 1024 | 17 | 4 | 0 | 3 |
| 2048 | 13 | 6 | 0 | 3 |
| 4096 | 5 | 11 | 0 | 3 |

FIG. 13

| RL | P |
|---|---|
| 128 | 11 |
| 256 | 1 |
| 512 | 12 |
| 1024 | 13 |
| 2048 | 15 |
| 4096 | 19 |

FIG. 15

| RL | Q |
|---|---|
| 128 | 4098 |
| 256 | 4098 |
| 512 | 8192 |
| 1024 | 16384 |
| 2048 | 32768 |
| 4096 | 65536 |

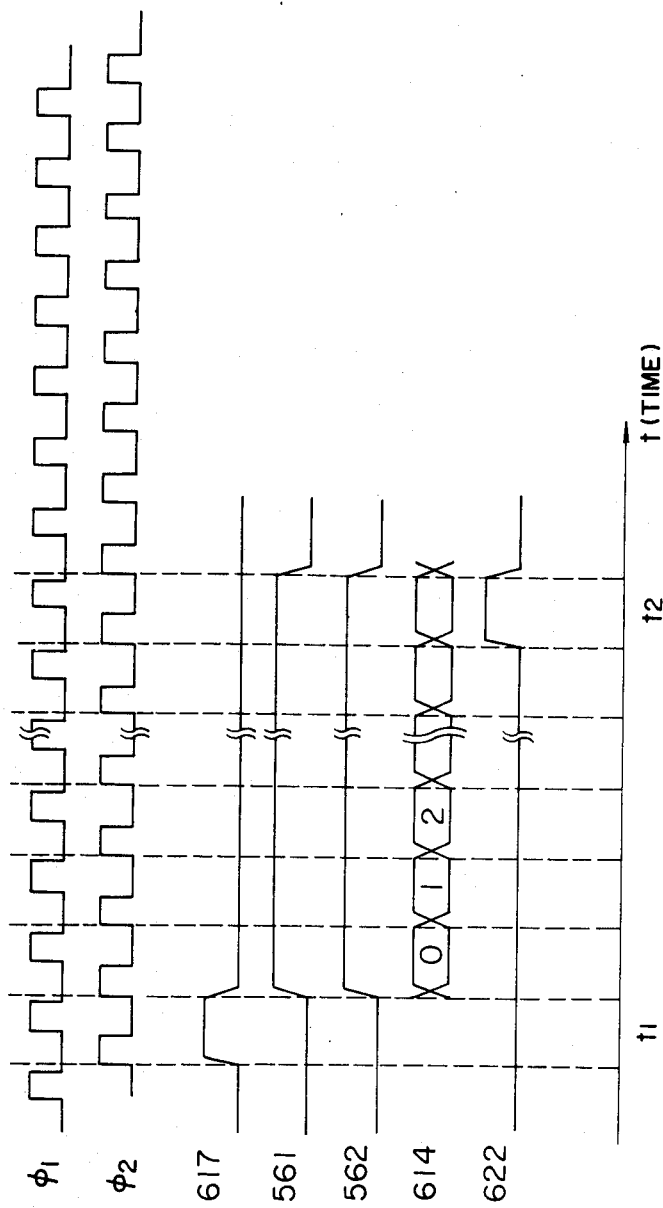

DECODING METHOD AND APPARATUS FOR CYCLIC CODES

BACKGROUND OF THE INVENTION

1. Field of the Invention

The present invention relates to method and apparatus for decoding a cyclic code.

2. Description of the Prior Art

A cyclic code is one of the codes for correcting a burst error (having a burst length b) generated in a data transmission line.

A generator polynomial of the cyclic code is expressed by $$G(x) = (x^c + 1) \prod_{i=1}^{l} P_i(x) \qquad (1)$$

where $P_i(x)$ is a $m_i$-order irreducible polynomial. The irreducible polynomial is defined as one which is not divisible without a residue by any polynomial having an order of no less than one and no more than $m_i - 1$. Hereinafter, $$m = \sum_{i=1}^{l} m_i$$

When the number of bits of the data is s and $n - m - c \geq s$ (where n is a code length of the cyclic code) and $c \geq 2b + d - 1$, any burst error which meets $b \leq m$ can be corrected. (See "Burst-Correcting Codes with High Speed Decoding" by Robert T. Chien, IEEE Trans. on Information Theory, Vol. IT-15, No. 1, January 1969.)

The code length n of the cyclic code is a least common multiple of a period $e_i$ of $P_i(x)$ and c, that is, LCM $(c, e_1, e_2, \ldots e_l)$.

The period $e_i$ of $P_i(x)$ is the order of a minimum order polynomial $(1 + x^{e_i})$ of polynomials which have forms of $(1 + x^a)$ and are divisible by P(x) without a residue.

At first an encoding method of the cyclic code is described.

I. Encoding Method of the Cyclic Code

Data D(x) to be transmitted is expressed as $$D(x) = a_{s-1} \cdot x^{s-1} + a_{s-2} \cdot x^{s-2} + \ldots + a_0 \qquad (2)$$

The cyclic code is encoded by expressing a product $D(x) \cdot x^{m+c}$ such that it is divisible by a generator polynomial G(x) without a residue. The polynomial D(x) represents data $(a_{s-1}, a_{s-2}, \ldots a_0)$ sent out to the transmission line.

A residue produced when $D(x) \cdot x^{m+c}$ is divided by G(x) is represented by a check pattern $R(x) = R_{m+c-1} \cdot x^{m+c-1} + R_{m+c-2} \cdot x^{m+c-2} + \ldots + R_0$ (a bit length of the check pattern R(x) is m+c). Thus, $$D(x) \cdot x^{m+c} = G(x) \cdot Q(x) + R(x)$$

where Q(x) is a quotient.

A code word F(x) of the cyclic code is represented by $$F(x) = D(x) \cdot x^{m+c} + R(x) \qquad (3)$$

F(x) is divisible by G(x) without a residue and the encoding of the cyclic code is terminated.

A divider for dividing $D(x) \cdot x^{m+c}$ by G(x) and producing the residue R(x) may be a conventional one.

II. Method of Decoding the Cyclic Code

A receiving station receives a code word F*(x). F*(x) is divided by the generator polynomial. It must be divisible without a residue if no error is included in F*(x). (The transmitted code word F(x) is divisible by G(x) without a residue.) However, if F*(x) includes a burst error B(x) starting from a (j+1)th bit, F*(x) is not divisible by G(x). F*(x) under this condition is represented by $$F^*(x) = F(x) + x^j \cdot B(x) \qquad (4)$$

The generator polynomial G(x) consists of the polynomial $(x^c + 1)$ and the irreducible polynomial $P_i(x)$. Residues produced by dividing F*(x) by those polynomials are syndromes $R_c(x)$ and RPi(x), respectively. Those syndromes are multiplied by $x^{n-j}$ and the products are divided by $(x^c + 1)$ and $P_i(x)$, respectively. If residues are equal, (j+1) represents the error position and $x^{n-j} \cdot RPi(x)$ represents the burst error B(x). Accordingly, the followings are met.

$$\left. \begin{array}{l} x^j \cdot B(x) \equiv R_c(x) \quad (\mathrm{mod}\ x^c + 1) \\ x^j \cdot B(x) \equiv RP_1(x) \quad (\mathrm{mod}\ P_1(x)) \\ \quad \vdots \\ x^j \cdot B(x) \equiv RP_l(x) \quad (\mathrm{mod}\ P_l(x)) \end{array} \right\} \qquad (5)$$

Both sides are multiplied by $x^{n-j}$ and the equations are rewritten as follows.

$$\left. \begin{array}{l} x^{n-j} \cdot R_c(x) \equiv x^n \cdot B(x) \equiv B(x) \quad (\mathrm{mod}\ x^c + 1) \\ x^{n-j} \cdot RP_1(x) \equiv x^n \cdot B(x) \equiv B(x) \quad (\mathrm{mod}\ P_1(x)) \\ \quad \vdots \\ x^{n-j} \cdot RP_l(x) \equiv x^n \cdot B(x) \equiv B(x) \quad (\mathrm{mod}\ P_l(x)) \end{array} \right\} \qquad (6)$$

where $x^j \cdot B(x) \equiv R_c(x)$ (mod P(x)) represents that the residues when divided by P(x) are equal.

Hereinafter, the following generator polynomial G(x) of the cyclic code is assumed.

$$G(x) = (x^{22}+1) \cdot (x^{12}+x^{11}+x^{10}+ \ldots +x+1) \cdot (x^{11}+x^7+x^6+x+1) \cdot (x^{11}+x^9+x^7+x^6+x^5+x+1) \qquad (7)$$

$$P_1(x) = x^{12} + x^{11} + x^{10} + \ldots + x + 1$$

$$P_2(x) = x^{11} + x^7 + x^6 + x + 1$$

$$P_3(x) = x^{11} + x^9 + x^7 + x^6 + x^5 + x + 1$$

In the polynomial (7), $(x^{12} + x^{11} + x^{10} + \ldots + x + 1)$ divides $(x^{13} + 1)$ and hence a period of $P_i(x)$ is 13. Periods of the polynomials $(x^{11} + x^7 + x^6 + x + 1)$ and $(x^{11} + x^9 + x^7 + x^6 + x^5 + x + 1)$ are 89 and 23, respectively. (See "Code Theory" by H. Miyagawa, Y. Iwadare and H. Imai, edited by Shokodo, page 530). Accordingly, the code length n is LCM (22, 13, 89, 23) = 585442, where LCM is a least common multiple. Thus, a single burst error up to 11 bits can be corrected.

FIG. 1 shows a decoder. FSRC denotes a divider which divides the input code F*(x) supplied via a signal line 160 by $(x^c + 1)$. FSRP$_1$, FSRP$_2$ and FSRP$_3$ denote dividers which divide the input code F*(x) by the polynomials P₁(x), P₂(x) and P₃(x), respectively. Details thereof will be explained in embodiments of the invention. A coincidence circuit 223 checks bit-by-bit coincidence of low order 11 bits of the FSRC and low order 11 bits of the FSRP₁. Coincidence circuits 324 and 325 check bit-by-bit coincidence of the low order 11 bits of the FSRP₁ and the low order 11 bits of the FSRP₂, and the bits of the FSRP₂ and the bits of the FSRP₃, respectively. A zero detector 326 checks if all of high order 11 bits of the FSRC and high order one bit of the FSRP₁ are zero. When the low order 11 bits of the FSRC, the low order 11 bits of the FSRP₁, the bits of the FSRP₂ and the bits of the FSRP₃ have bit-by-bit correspondence and the high order 11 bits of the FSRC and the high order one bit of the FSRP₁ are zero, a signal line 171 connected to an output of an AND gate 170 is rendered high level.

When the input code F*(x) has been inputted to the FSRC, FSRP₁, FSRP₂ and FSRP₃, syndromes $S_c(x)$, $S_{p1}(x)$, $S_{p2}(x)$ and $S_{p3}(x)$ therefor meet the following relationships because the input code is inputted to an m'-th stage of respective shift registers (m'=min (m₁, m₂, m₃)).

$$\left. \begin{array}{ll} x^{j+m'} \cdot B(x) \quad S_c(x) & (\text{mod } x^c + 1) \\ x^{j+m'} \cdot B(x) \quad S_{p1}(x) & (\text{mod } P_1(x)) \\ x^{j+m'} \cdot B(x) \quad S_{p2}(x) & (\text{mod } P_2(x)) \\ x^{j+m'} \cdot B(x) \quad S_{p3}(x) & (\text{mod } P_3(x)) \end{array} \right\} \quad (8)$$

By multiplying both sides of the equations (8) by $x^{n-j-m'}$, the left sides become B(x). It represents that all low order m' bits of the FSRC, FSRP₁, FSRP₂ and FSRP₃ are coincident and all bits in higher orders than m' are zero. B(x) represents the error pattern and j represent an error location.

In this prior art decoding method, a maximum of (n−m') times of shifting are necessary to find j.

When such a cyclic code is actually used, a maximum of (n−m') times of shifting are required whatever low the order of the input code F*(x) is.

For example, in a disk data, one sector has 128 bytes (1024 bits) or 256 bytes (2047 bits). On the other hand, in a fire code which uses the generator polynomial G(x) as represented by the formula (7), n=585442 which is approximately 200–500 times as long. Even in this case, approximately 580 thousands times of shifting are required.

In order to reduce the number of times of shifting, it has been proposed to use the "Chinese Remainder Theorem" (See "Burst-Correcting Codes with High Speed Decoding" referenced above.) However, this method requires an integer divider having a divisor n and hence a complex hardware.

SUMMARY OF THE INVENTION

It is an object of the present invention to provde a method and apparatus for decoding a cyclic code with a reduced number of times of shifting and small increase of hardware, for an input code having a short code length.

In describing the present invention, let us assume that the input code F*(x) is represented as follows.

$$F^*(x) = b_{s+m+c-1} \cdot x^{s+m+c-1} + b_{x+m+c-2} \cdot x^{s+m+c-2} + \ldots + b_0 \quad (9)$$

where s is the length of the data field of the input code and n>>x+m+c, and $b_{s+m+c-1} \sim b_0$ are input data bits.

The code length of the Cyclic code F(x) is n. Accordingly, coefficients of terms $x^{n-1}$ to $x^{s+m+c}$ in the formula (9) are zero.

In order to detect the burst error from the input code F*(x), at least (n−s−m−c) times of shifting by the formula (8) are required. Since n>>s+m+c, the number of times of shifting is very large. In other words, the error location j cannot be detected before such number of times of shifting. If most parts of the huge number of times of shifting can be omitted, the object of the present invention can be attained.

In the present invention, the following points were noticed.

I. The irreducible polynomial $P_i(x)$ has a period $e_i$. It means that if a product of a polynomial $R_{pi}(x)$ having a lower order than $P_i(x)$ and $x^{ei}$ is divided by $P_i(x)$, a residue is equal to the polynomial $R_{pi}(x)$. For example, in FIG. 1, if the input signal 160 is all-zero, a content of the divider FSRP₁ returns to the original one after $e_1$ times of shifting.

II. When the code word F(x) of a cylic code is divided into $e_i$-bit blocks (where i is an arbitrary number), the input code word F*(x) appears in the latter half blocks.

III. The polynomial $(x^c+1)$ also has a period c. For example, if the input signal 160 is all-zero, the content of the divider FSRC of FIG. 1 returns to the original one after c times of shifting.

IV. The polynomial $P_i(x)$ and the polynomial $(x^c+1)$ have different periods from each other. When the polynomials $R_{p1}(x), \ldots, R_{pi}(x), R_c(x)$ are multiplied by $x^{ei'}$ and the products are divided by $P_1(x), \ldots, P_l(x), (x^c+1)$, respectively, $x^{ei'} \cdot R_{pi}(x) \equiv R_{pi}(x)$ (mod $P_i(x)$) when i=i'

$x^{ei'} \cdot R_{pi}(x) \equiv x^{ei' - \beta i e i} \cdot R_{pi}(x)$ (mod $P_i(x)$) when i=i'

$x^{ei'} \cdot R_c(x) \equiv x^{ei' - \beta c C} \cdot R_c(x)$ (mod $x^c+1$) for polynomial $(x^c+1)$ where $\beta_i$ is a largest integer which satisfies $e_i' \geq \beta_i e_i$, and $\beta_c$ is a largest integer which satisfies $e_i' \geq \beta_c C$.

The integers $\beta i$ and $\beta_c$ can be obtained by calculation. Then, $(e_i' - \beta_i e_i)$ and $(e_i' - \beta_c C)$ are obtained, and $x^{ei' - \beta i e i} \cdot R_{pi}(x)$ is divided by $P_i(x)$ and $x^{ei' - \beta c C} \cdot R_c(x)$ is divided by $(x^c+1)$. This is equivalent to multiplying $R_{pi}(x)$ and $R_c(x)$ by $e_i'$, respectively and then dividing products obtained by the multiplication by $P_i(x)$ and $(x^c+1)$, respectively.

V. The order (s+m+c) of the input code F*(x) is much smaller than the code length n.

In the prior art decoding method, at least (n−s−m−c) times of division are required before the error location is detected. The periods $e_i$ and c are cycled $t_i$ and $t_c$ times (i=1−l) respectively, during this period. The values of $t_i$ and $t_c$ can be obtained by calculation. On the other hand, $x^{ei' \cdot ti} \cdot R_{pi}(x) \equiv R_{pi}(x)$ (mod $P_i(x)$) for i=i'

$x^{ei' \cdot ti} \cdot R_{pi}(x) \equiv x^{pi} \cdot R_{pi}(x)$ (mod $P_i(x)$) for i≠i'

$x^{ei' \cdot ti} \cdot R_c(x) \equiv x^{pc} \cdot R_c(x)$ (mod $x^c+1$) for polynomial $(x^c+1)$ The periods $e_i$ and c are cycled $k_i$ and $k_c$ times, respectively, during ($e_i' \cdot t_i'$) cycles. The difference between $e_i' \cdot t_i'$ and $e_i \cdot k_i$ is $P_i$, and the difference between $e_i' \cdot t_i'$ and $c \cdot k_c$ is $P_c$. For i=i', it may be regarded that $P_i=0$. $P_i$ and $P_c$ can be obtained by calculation. Thus, if $P_i$ and $P_c$ are calculated, $R_{pi}(x)$ is multiplied by $x^{pi}$, $R_c(x)$ is multiplied by $x^{pc}$ and the products are divided by $P_i(x)$ and $(x^c+1)$, respectively, it is equivalent to multiplying $R_{pi}(x)$ and $R_c(x)$ by $x^{ei' \cdot ti'}$, respectively, and dividing the products by $P_i(x)$ and $(x^c+1)$, respectively.

VI. Those are sequentially multiplied by x and the products are divided by $P_i(x)$ and $(x^c+1)$, respectively. The error location is detected by the number i' of multiplication by x when the residues of both divisions are equal.

The above operations will be represented by formulas.

The syndromes $R_{pi}(x)$ and $R_c(x)$ are first determined.

$$R_{p1}(x) \equiv F^*(x) \pmod{P_1(x)}$$
.
.
.
$$R_{pl}(x) \equiv F^*(x) \pmod{P_l(x)}$$
$$R_c(x) \equiv F^*(x) \pmod{x^c + 1}$$

Then, $R_{pi}(x)$ and $R_c(x)$ are multiplied by $x^{pi}$ and $x^{pc}$, respectively, and the products are divided by $P_i(x)$ and $(x^c+1)$, respectively. For i=i', $P_i=0$.

$$x^{p1} \cdot R_{p1}(x) \equiv x^{ei' \cdot ti'} \cdot R_{p1}(x) \pmod{P_1(x)}$$
.
.
.
$$x^{pl} \cdot R_{pl}(x) \equiv x^{ei' \cdot ti'} \cdot R_{pl}(x) \pmod{P_l(x)}$$
$$x^{pc} \cdot R_c(x) \equiv x^{ei' \cdot ti'} \cdot R_c(x) \pmod{x^c + 1}$$

Finally, those are multiplied by $x^j$, respectively.

$$B_{p1}(x) \equiv x^{j+p1} \cdot R_{p1}(x) \equiv x^{j+p1} \cdot F^*(x) \pmod{P_1(x)}$$
.
.
.
$$B_{pl}(x) \equiv x^{j+pl} \cdot R_{pl}(x) \equiv x^{j+pl} \cdot F^*(x) \pmod{P_l(x)}$$
$$B_c(x) \equiv x^{j+pc} \cdot R_c(x) \equiv x^{j+pc} \cdot F^*(x) \pmod{x^c + 1}$$

The j when all of $B_{p1}(x) \sim B_{pl}(x)$ and $B_c(x)$ are equal represents the error location. The $B_{p1}(x)$ at this time represents the burst error B(x) pattern.

As described above, in the cyclic code which uses the generator polynominal G(x) shown in the formula (7), the code length n is 585442 and approximately 580 thousands times of shifting are required to detect the error. On the other hand, the number of bits of the disk data is 1024 or 2048 bits. When the number s of data bits are much smaller than the code length n, the order (s+m+c) of the input code F*(x) represented by the formula (9) is much smaller than n and the terms $x^{n-1}$ to $x^{s+m+c}$ of the code word F(x) of the cyclic code are zero. In the present invention, when the order of the input code F*(x) is smaller than the code length n of the cyclic code, for most parts of the code word F(x) of the cyclic code which lack the initial input code word F*(x), the results of shifting by the dividers if the shifting were made for the above parts are set by a smaller number of times of preshifting determined by calculation. Then, for the position which includes the input code F*(x), the error location is detected by the cyclic code system.

The irreducible polynomial $P_i(x)$ and the polynomial $(x^c+1)$ have respective periods, and the syndromes for those polynomials set in the dividers when the input code is received return to their original contents after the numbers of times of shifting corresponding to the periods of the respective polynomials, if the input code is all-zero. Accordingly, the code word F(x) of the cyclic code is divided into the number of blocks equal to the number of bits of the period $e_n$ of the polynomial $P_n(x)$, and for those blocks from the beginning of the code word F(x) of the cyclic code to the block immediately before the block which includes the highest order code of the input code F*(x) (hereinafter referred to a block containing no input code F*(x)), the content of the divider for the polynomial $P_n(x)$ is not changed because it has shifted by an integer multiple of the period. For the other dividers, if they shift by maximum integer multiples of the periods of the corresponding polynomials included in the blocks which do not include the input code word F*(x), the contents of the dividers return to the original ones, respectively. Thus, by shifting the divider by the number of code bits remaining in the block, the result after the shifting of the above parts is obtained. In this manner, for the blocks which do not contain the input code word F*(x), the shift results by the dividers are obtained by the small number of times of preshifting determined by the calculation.

Accordingly, in accordance with the present invention, when the order of the input code word F*(x) is smaller than the code length n of the cyclic code, the number of times of shifting can be reduced to shorten the decoding time. Portions of the code words of the cyclic code which include the input code word F*(x) are decoded by the cyclic code system without using complex hardware as required in a high speed decoding method. Thus, in accordance with the present invention, the high speed decoding is attained without complex hardware. It is realized by adding a small amount of hardware for controlling preshifting.

BRIEF DESCRIPTION OF THE DRAWINGS

FIG. 5 illustrates calculation,
FIG. 13 illustrates calculation,
FIG. 14 shows a timing chart,
and
FIG. 15 illustrates calculation.

DESCRIPTION OF THE PREFERRED EMBODIMENTS

Figure 1:
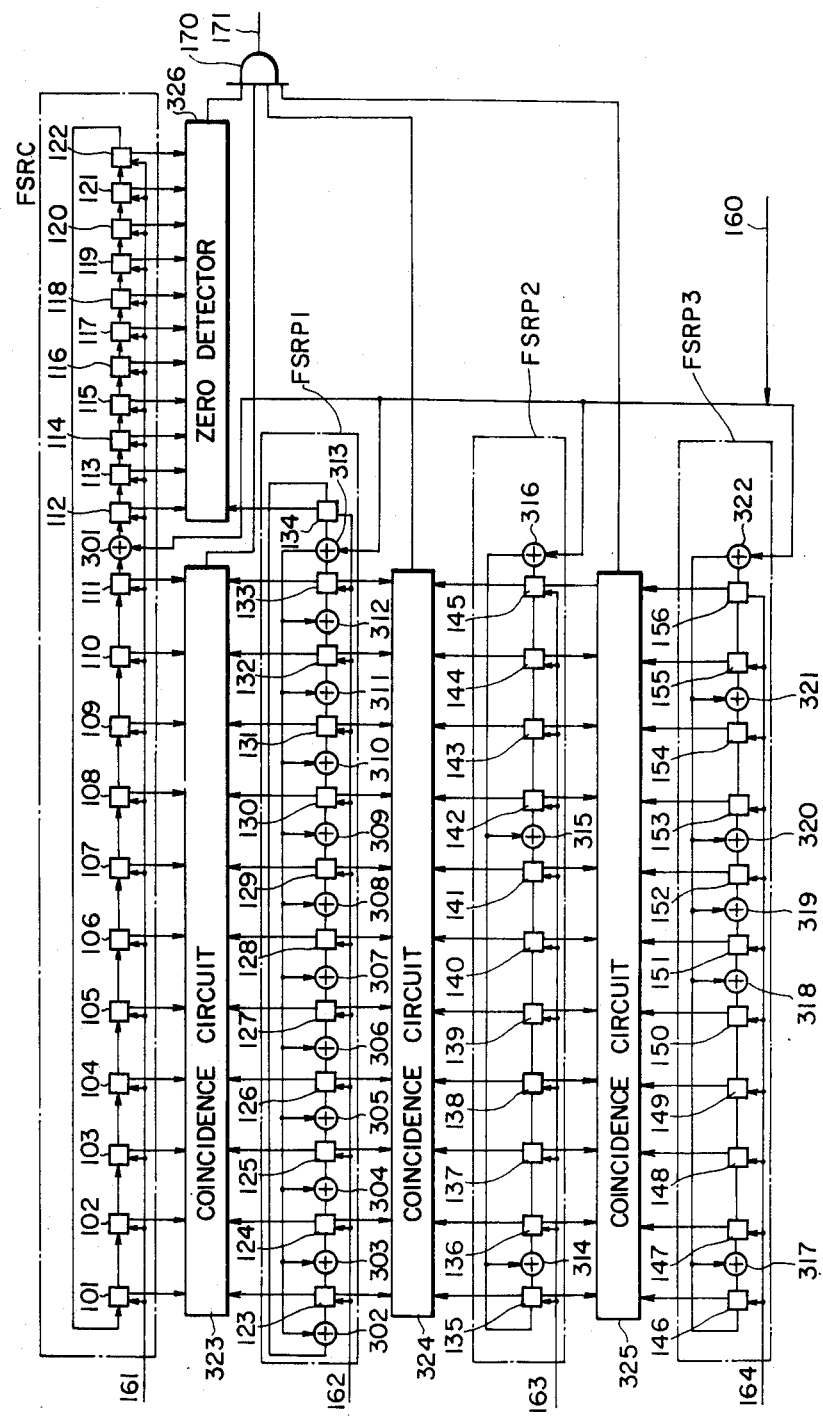
FIG. 1 shows a decoding circuit for a cyclic code used in the present invention.

One embodiment of the present invention will now be explained by referring to the drawings. Let us assume that the cyclic code which uses the generator polynomial G(x) as represented by the formula (7). As described above, the periods of the polynomials $(x^{22}+1)$, $(^{12}+x^{11}+x^{10}+\ldots+x+1)$ are 22, 13, 89 and 23, respectively. Accordingly, the code length n is given by $$n = LCM(22, 13, 89, 23) = 22 \times 13 \times 89 \times 23 = 585442$$

The length of the check pattern R(x) is 32 bits. One burst error up to 11 bits is correctable.

Figure 2:
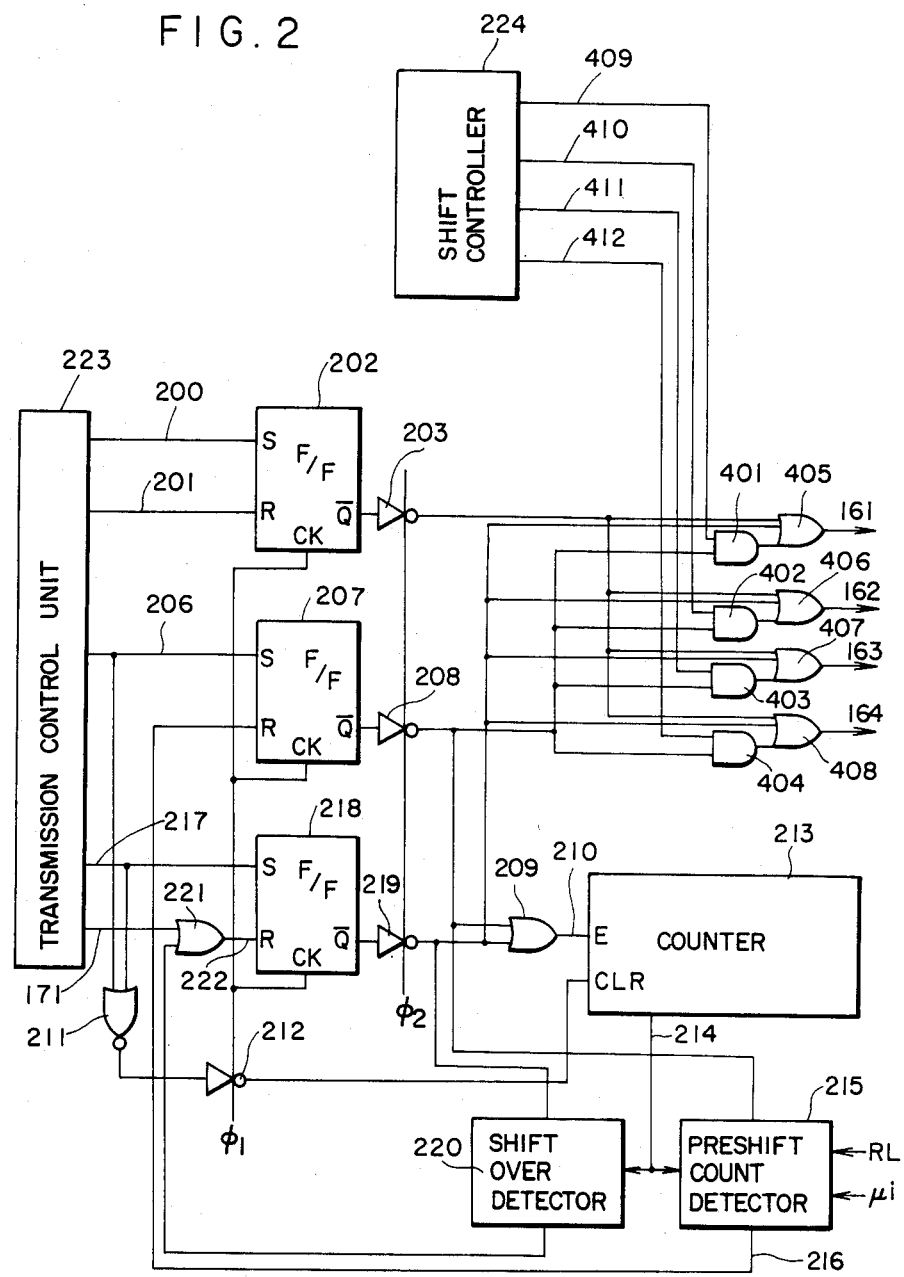
FIG. 2 shows a control circuit in one embodiment of the present invention.

FIGS. 1 and 2 show a decoder for the cyclic code represented by the formula (7) and a control circuit therefor. Stages 101-122 and an exclusive OR gate 301 constitute the divider FSRC having the polynomial $(x^{22}+1)$ as a divisor. Stages 123-134 and exclusive OR gates 302-313 constitute the divider FSRP$_1$ having the polynomial $(x^{12}+x^{11}+x^{10}+\ldots+x+1)$ as a divisor. Stages 135-145 and exclusive OR gates 314-316 constitute the divider FSRP$_2$ having the polynomial $(x^{11}x^7+x^6+x+1)$ as a divisor. Stages 146-156 and exclusive OR gates 137-322 constitute the divider FSRP$_3$ having the polynomial $(x^{11}+x^9+x^7+x^6+x^5+x+1)$ as a divisor.

The coincidence circuit 323 checks the coincidence between the low order 11 bits of the FSRC and those of the FSRP$_1$, that is, the stages 101 and 123, 102 and 124, 103 and 125, 104 and 126, 105 and 127, 106 and 128, 107 and 129, 108 and 130, 109 and 131, 110 and 132, and 111 and 133. The coincidence circuit 324 checks the coincidence between the low order 11 bits of the FSRP$_1$ and those of the FSRP$_2$, that is, the stages 123 and 135, 124 and 136, 125 and 137, 126 and 138, 127 and 139, 128 and 140, 129 and 141, 130 and 142, 131 and 143, 132 and 144, and 133 and 145. The coincidence circuit 325 checks the coincidence circuit 325 checks the coincidence between the stages of the FSRP$_2$ and the FSRP$_3$, that is, the stages 135 and 146, 136 and 147, 137 and 148, 138 and 149, 139 and 150, 140 and 151, 141 and 152, 142 and 153, 143 and 154, 144 and 155, and 145 and 156. The zero detector 326 checks if all of the stages 112-122 and 134 are zero. An AND gate 170 produces a high level output on a signal line 171 when all of the outputs of the coincidence circuits 323-325 and the zero detector 326 are high level. Namely, the signal line 171 is asserted when all of the low order 11 bits of the FSRC, the low order 11 bits of the FSRP$_1$, the bits of the FSRP$_2$ and the bits of the FSRP$_3$ are coincident, and all of the high order 11 bits of the FSRC and the high order one bit of the FSRP$_1$ are zero.

When the signal line 161 is high, the shifting by the FSRC is effected, and when the signal line 162, 163 or 164 are high, the shifting by the FSRP$_1$, FSRP$_2$ or FSRP$_3$ is effected.

The decoding operation is now explained. The decoding is done by the following three steps.

Figure 3:
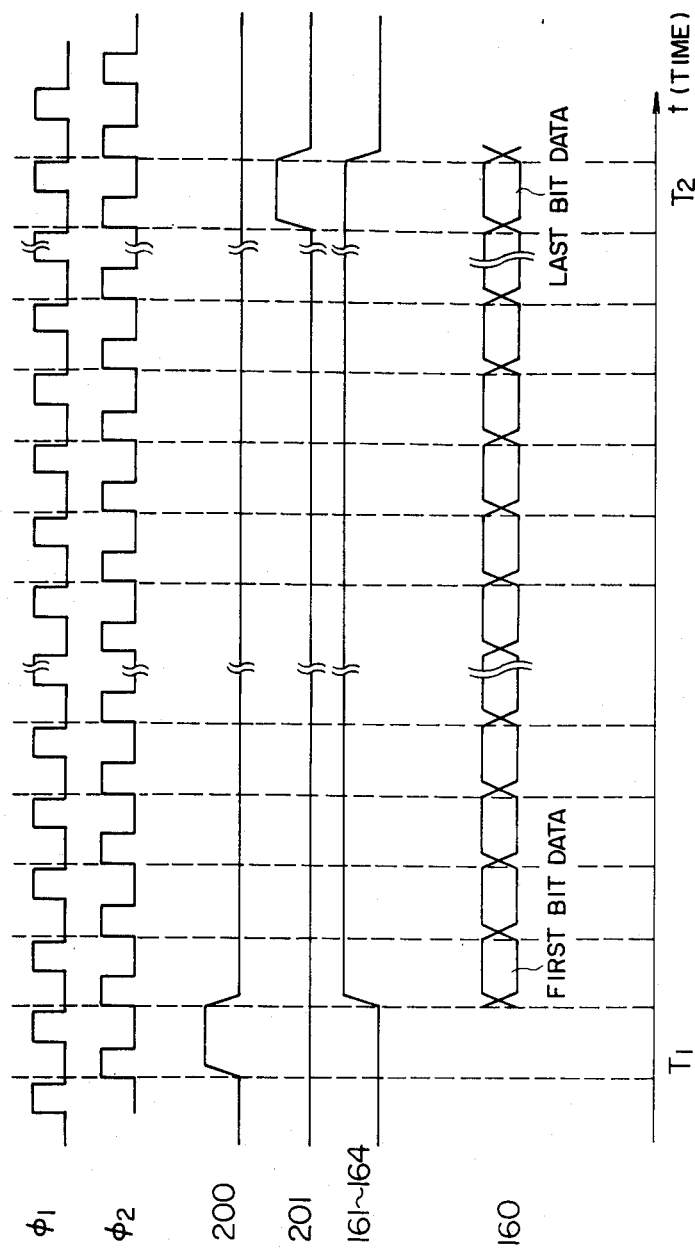
FIGS. 3 and 4 show timing charts for the circuit of FIG. 2.
Figure 4:
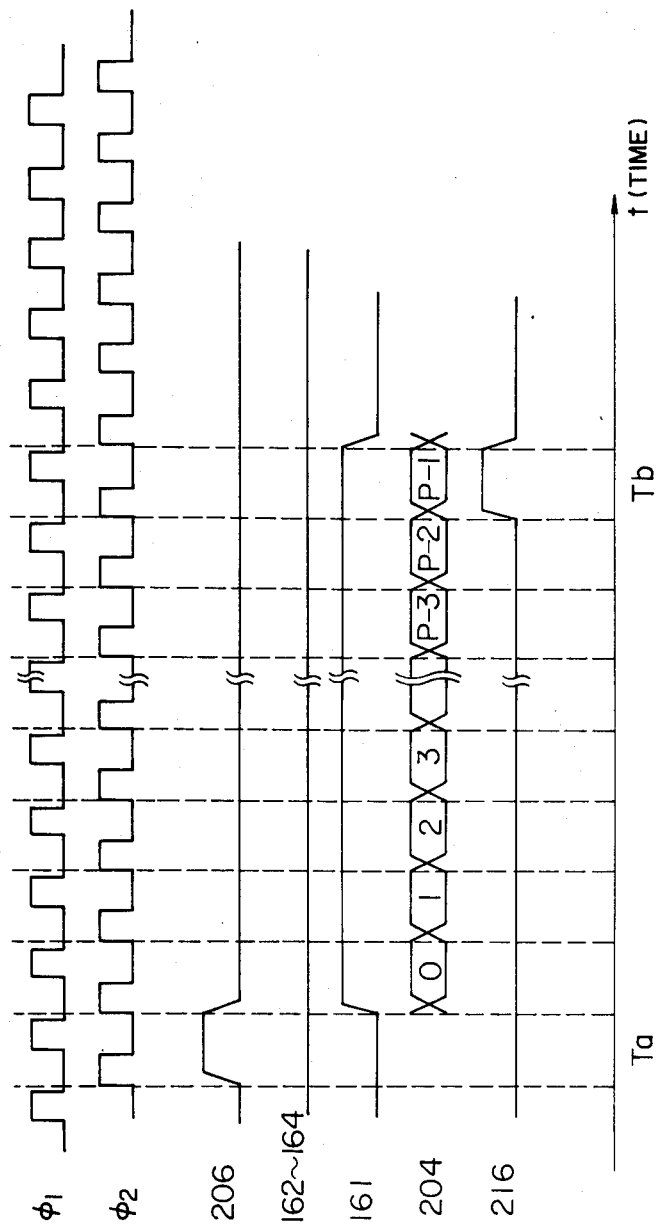

(S1) Generation of syndromes $S_c(x)$, $S_{p1}(x)$, $S_{p2}(x)$ and $S_{p3}(x)$ (S2) Preshifting of FSRC, FSRP$_1$, FSRP$_2$ and FSRP$_3$ (S3) Determination of error pattern B(x) and error location j A circuit shown in FIG. 2 controls the above three steps, and FIGS. 3, 4 and 5 show timing charts for the processes in the steps (S1), (S2) and (S3), respectively. The processes in the steps (S1), (S2) and (S3) will now be explained.

The step (S1)-generation of syndromes is first explained. In FIG. 1, the input data 160 is supplied to the FSRC, FSRP$_1$, FSRP$_2$ and FSRP$_3$ through the exclusive OR gates 301, 313, 316 and 322, respectively. A set of the contents of the FSRC, FSRP$_1$, FSRP$_2$ and FSRP$_3$ at the end of the inputting of the data is the syndrome to the cyclic code.

Shift enable signals 161-164 are generated by the circuit of FIG. 2 and a timing thereof is shown in the timing chart of FIG. 3. Referring to FIGS. 2 and 3, a signal line 200 from a transmission control unit 223 for controlling the signal reception is rendered high level in synchronism with a clock $\phi_2$ at a timing T$_1$ one clock before the first bit data of the input data 160 (F*(x)) is supplied to the decoder. The signal line 200 sets the $\overline{Q}$-output of a flip-flop 202 to the low level, and the $\overline{Q}$-output is sent to signal lines 161-164 through a clock gate 203 which receives a clock input $\phi_2$ and OR gates 405-408. Accordingly, the signal lines 161-164 are rendered high level in synchronism with the first bit data of the input data 160. A signal line 201 indicates the end of the input data. It is rendered high level at a timing T$_2$ in synchronism with the last bit data of the input data. The signal line 201 renders the $\overline{Q}$-output of the flip-flop 202 high level and renders the signal lines 161-164 low level through the clocked gate 203 and the OR gates 405-408. As shown in FIG. 3, when the syndromes $S_c(x)$, $S_{p1}(x)$, $S_{p2}(x)$ and $S_{p3}(x)$ are generated, the signal lines 161-164 are rendered high level only for the period of data input. The set of contents of the dividers FSRC, FSRP$_1$, FSRP$_2$ and FSRP$_3$ at the end of inputting of the last bit of the input data is the syndrome. In FIGS. 2, 3, 4 and 6, $\phi_1$ and $\phi_2$ represent non-overlapping two-phase clocks.

The step (S2)-preshifting will now be explained. In this step, shiftings are effected in the FSRC, FSRP$_1$, FSRP$_2$ and FSRP$_3$ by $\mu_c$, $\mu_1$, $\mu_2$ and $\mu_3$ times, respectively. Calculation method for $\mu_c$, $\mu_1$, $\mu_2$ and $\mu_3$ will be explained later. The preshifting serves to substantially reduce the number of times of shifting when the length of the input code F*(x) is short, such as the disk data.

In FIG. 2, preshift select signals 409-412 from a shift controller 224 which controls the shifting of the dividers are supplied to AND gates 401-404. When the preshift select signals 409-412 are high level, an output of a clocked gate 208 is transmitted to the signal lines 161-164 through the respective OR gates 405-408. The operation for preshifting the FSRC by $\mu_c$ times will be explained first. The preshift select signal 409 is high level and the preshift select signals 410-412 are low level.

A preshift start signal 206 renders the $\overline{Q}$-output of the flip-flop 207 low level at a timing Ta (FIG. 4), and it is transmitted to the clocked gate 208 which receives the clock input $\phi_2$, the AND gates 401-404 and the OR gate 209. Thus, the signal lines 161 and 210 are rendered high level. The high level on the signal line 161 permits the shifting of the FSRC, and the high level on the signal line 210 permits the incrementing of the counter 213. The preshift start signal 206 is supplied to a clear terminal of a counter 213 through a NOR gate 211 and a clocked gate 212 which receives a clock input $\phi_1$. As a result, an output 214 from the counter 213 is set to "0"

in synchronism with the clock signal following the preshift start signal 206. A record length RL and a calculated number $\mu_i$ of times of preshifting are supplied to a preshift count dectector 215, which sets the signal line 216 at high level and resets the flip-flop 207 when the output of the clocked gate 208 is high level and the output 214 of the counter 213 is ($\mu_c - 1$) (at a timing Tb). As shown in FIG. 4, the signal line 161 is set to the high level only for the durations of the $\mu_c$ clocks so that the shifting is effected $\mu_c$ times in the FSRC. The preshiftings in the FSRP$_1$, FSRP$_2$ and FSRP$_3$ are effected in the same manner as the preshifting in the FSRC. Of the preshift select signals 409–412, only the signal 410, 411 or 412 is rendered high level, and the signal line 216 is rendered high level to reset the flip-flop 207 when the preshift count detector 215 detects ($\mu_1 - 1$), ($\mu_2 - 1$) or ($\mu_3 - 1$). When the preshift count is zero, preshifting need not be effected.

The numbers $\mu_c$, $\mu_1$, $\mu_2$ and $\mu_3$ of times of preshifting are explained below. In the formula (7), the periods of the polynomials $(x^{22}+1)$, $(x^{12}+x^{11}+x^{10}+\ldots+x+1)$, $(x^{11}+x^7+x^6+x+1)$ and $(x^{11}+x^9+x^7+x^6+x^5+x+1)$ are 22, 13, 89 and 23, respectively, as described above. Accordingly, the patterns of the FSRC, FSRP$_1$, FSRP$_2$ and FSRP$_3$ return to the original ones after 22, 13, 89 and 23 times of shifting, respectively. Accordingly, if the shifting is omitted by a number of times equal to a multiple of 89, no preshifting is required for the FSRP$_2$ and the preshiftings are required for the FSRC, FSRP$_1$ and FSRP$_3$, 21, 12 and 22 times at maximum in accordance with the number of times of shifting omitted. The numbers of times of preshifting are $\mu_c$, $\mu_1$ and at this time it is possible to regard that $\mu_3$ and $\mu_2$ is zero.

The $\mu_c$, $\mu_1$ and $\mu_3$ are formulated under the condition of no preshifting in the FSRP$_2$, that is, $\mu_2 = 0$, a (RL×8+56)-bit data including a 56-bit cyclic code check pattern R(x) is recorded on the disk, where RL is the number of bytes of the record of the disk data. Accordingly, the length S of the input code word F*(x) is RL×8+56 and a maximum of 585442−(RL×8+56) times of shifting can be omitted. If $$585442 - \left\lceil \frac{RL \times 8 + 56}{89} \right\rceil \times 89 \qquad (10)$$

of leading bits are all-zero, the numbers $\mu_c$, $\mu_1$ and $\mu_3$ of times of preshift in the FSRC, FSRP$_1$ and FSRP$_3$ are represented by $$\mu_c = 585442 - \left\lceil \frac{RL \times 8 + 56}{89} \right\rceil \times 89 \qquad (\text{mod } 22)$$

$$\mu_1 = 585442 - \left\lceil \frac{RL \times 8 + 56}{89} \right\rceil \times 89 \qquad (\text{mod } 13)$$

$$\mu_3 = 585442 - \left\lceil \frac{RL \times 8 + 56}{89} \right\rceil \times 89 \qquad (\text{mod } 23)$$

FIG. 5 shows examples of calculation of RL, $\mu_c$, $\mu_1$ and $\mu_3$, where [a] indicates a round-up number of a.

For the cyclic code having the generator polynomial shown in the formula (1), the numbers of times of preshifting when no shifting is effected in the FSRP$_i'$ are represented by $$\mu_c = n - \left\lceil \frac{RL \times 8 + m}{e_i'} \right\rceil \times e_i' \qquad (\text{mod } c)$$

$$\mu_i = n - \left\lceil \frac{RL \times 8 + m}{e_i'} \right\rceil \times e_i' \qquad (\text{mod } e_i)$$

Figure 6:
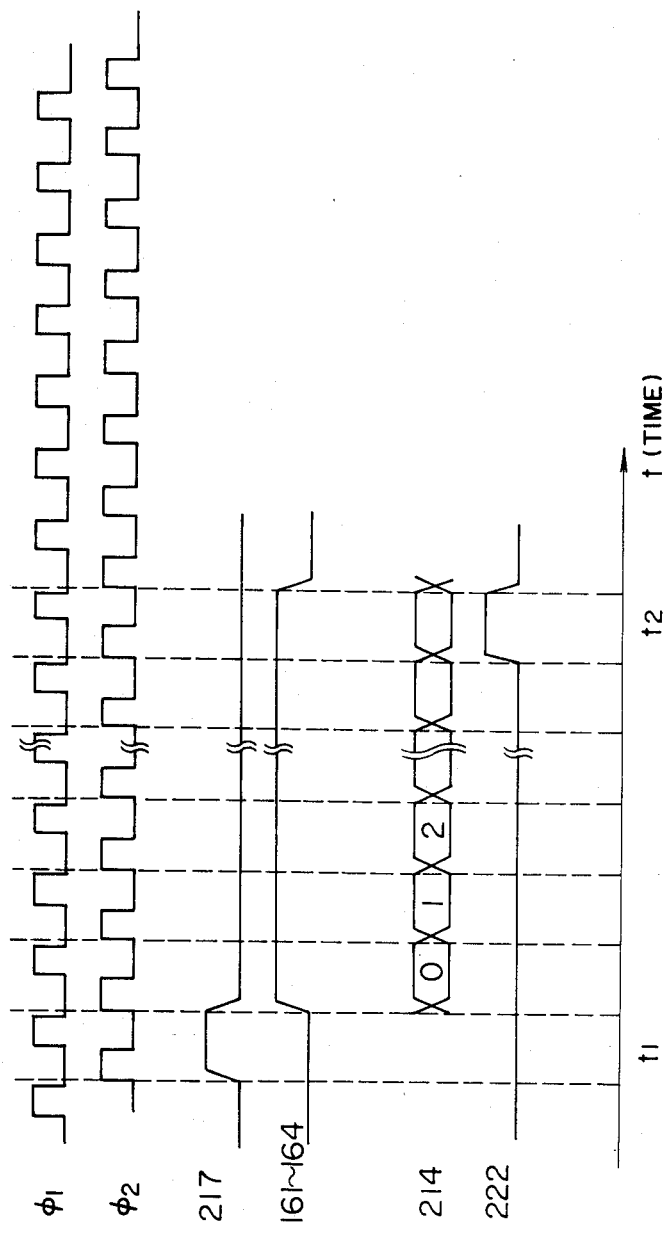
FIG. 6 shows a timing chart fot the circuit of FIG. 2.

The final step (S3) will now be explained. This step determines the error pattern B(x) and the error location j. In FIG. 2, the error detection start signal 217 renders the Q-output of the flip-flop 218 low level at a timing $t_1$ (FIG. 6) and renders the signal lines 161–164 high level through the clocked gate 219 which receives the clock input $\phi_2$ and the OR gates 405–408 and 209. At the same time, the error detection start signal 217 clears the counter 213 through the NOR gate 211 and the clocked gate 212. As shown in FIG. 6, the signal lines 161–164 are rendered high level at the clock $\phi_2$ following to the error detection start signal 217 to start the shiftings in the FSRC, FSRP$_1$, FSRP$_2$ and FSRP$_3$, and the output 214 of the counter 213 is incremented from "0".

The shiftings in the FSRC, FSRP$_1$, FSRP$_2$ and FSRP$_3$ are effected until any of the following conditions is met.

(C1) The low order 11 bits of the FSRC, the low order 11 bits of the FSRP$_1$, the bits of the FSRP$_2$ and the bits of the FSRP$_3$ are coincident, and the high order 11 bits of the FSRC and the high order one bit of the FSRP$_1$ are all-zero.

(C2) The number of times of shifting exceeds a predetermined number Q.

When the condition (C1) is met, the signal line 171 in FIG. 1 is asserted, and the error pattern is represented by the low order 11 bits of the FSRC and the error location is at $$585442 - \left\lceil \frac{RL \times 8 + 56}{89} \right\rceil \times 89 +$$

number $i$ of times of shifting from the leading position. The condition (C2) is detected by a shift over detector 220 of FIG. 2 by the output of the clocked gate 219 and the counter output 214. The number Q may be a number larger than RL×8+56. The condition (C2) indicates the occurrence of a uncorrectable error.

When the condition (C1) or (C2) is detected, the signal line 222 in FIG. 2 is rendered high level through the OR gate 221 and the flip-flop 218 is reset at a timing $t_2$ (FIG. 6). As shown in FIG. 6, when the error detection start signal 217 is rendered high level, the signal lines 161–164 are rendered high level at the next clock $\phi_2$ and the counter output 214 is incremented from "0". When the condition (C1) or (C2) is thereafter detected, the signal line 222 is rendered high level and the signal lines 161–164 are negated. The incrementing of the counter is stopped.

The steps (S1), (S2) and (S3) described above are the decoding method for the cyclic code in the present invention.

Assuming that the cyclic code uses the generator polynomial represented by the formula (7) and the record length RL is 1024 bytes, the prior art method required a maximum of (585442-11) times of shifting while the present method requires only 8277+17+4+3=8301 times of shifting. Assuming that one shift cycle requires 100 ns (10 MHz), the prior art method needs approximately 59.5 seconds while the present method needs only 0.8 second. An advantage from a practical use is great.

When the high speed decoding method based on the Chinese Remainder Theorem is used, even a 16-bit microcomputer is not appropriate because multiplication/division of integers of [$\log_2$ 585442]=20 digits is required. The present method does not need such multiplication/division.

A second embodiment of the present invention in which the number of irreducible polynomials in the generator polynomial of the cyclic code is one is explained below.

The Fire code is one of the codes which correct the burst error (having a length b) occurring in the data transmission line. (See "Code Theory" referenced above, page 309.)

The generator polynomial of the Fire code is represented by $$G(x) = P(x)(x^c + 1) \quad (11)$$

where $P(x)$ is the irreducible polynomial. The irreducible polynomial of order m is defined as one which is not divisible without a residue by any polynomial having an order no less than one and no more than $m-1$.

When the number of bits (code length) of the data is s and $n-m-c \geq s$ (where n is a code length of the Fire code) and $c \geq 2b-1$, all burst errors which meet $b \leq m$ can be corrected.

The code length n of the Fire code is a least common multiple of a period e of $P(x)$ and c.

The period e of $P(x)$ is the order of a minimum order polynomial $(1+x^e)$ of polynomials which have forms of $(1+x^\alpha)$ and are divisible by $P(x)$ without a residue.

An encoding method of the Fire code is first described.

(1) Encoding method of the Fire code

Data $D(x)$ to be transmitted is expressed as $$D(x) = a_{s-1} \cdot x^{s-1} + a_{s-2} \cdot x^{s-2} + \ldots + a_0 \quad (12)$$

The Fire code is encoded by expressing a product $D(x) \cdot x^{m+c}$ such that it is divisible by a generator polynomial $G(x)$ without a residue. The polynomial $D(x)$ represents a bit data $(a_{s-1}, a_{s-2}, \ldots a_0)$ sent out to the transmission line.

A residue produced when $D(x) \cdot x^{m+c}$ is divided by $G(x)$ is represented by a check pattern $R(x) = R_{m+c-1} \cdot x^{m+c-1} + R_{m+c-2} \cdot x^{m+c-2} + \ldots + R_0$ (a bit length of the check pattern $R(x)$ is $m+c$). Thus, $$D(x) \cdot x^{m+c} = G(x) \cdot Q(x) + R(x)$$

where $Q(x)$ is a quotient.

The code word of the Fire code is represented by $$F(x) = D(x) \cdot x^{m+c} + R(x) \quad (13)$$

$F(x)$ is divisible by $G(x)$ without a residue and the encoding of the Fire code is terminated.

Figure 7:
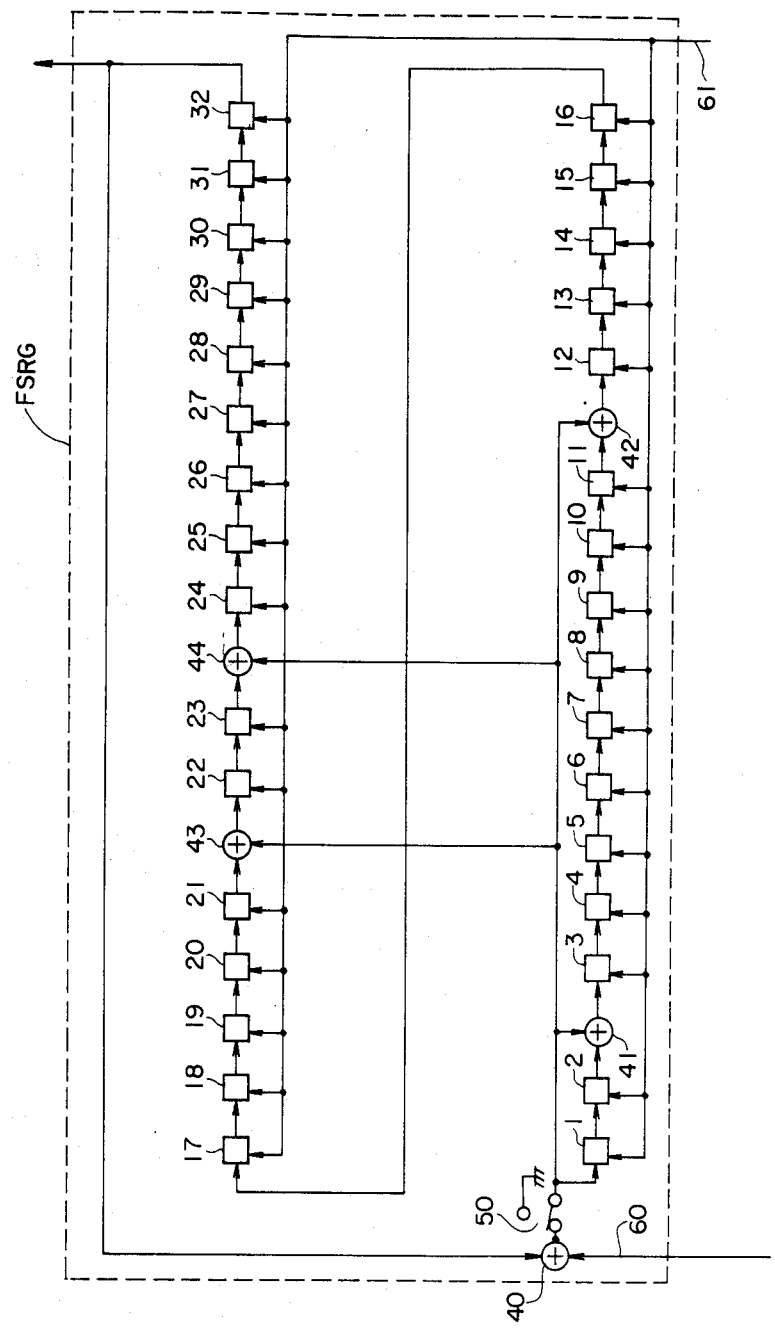
FIG. 7 shows an encoding circuit for a Fire code.

FIG. 7 shows an encoder FSRG when the generator polynomial $G(x)$ used is represented by $$G(x) = (x^{11} + x^2 + 1)(x^{21} + 1) = x^{32} + x^{23} + x^{11} + x^2 + 1 \quad (14)$$

The FSRG is a divider which divides the transmitted bit data $D(x)$ by the polynomial represented by the formula (14). Numerals 1-32 in FIG. 7 denote stages in shift registers. A total number of stages is equal to the maximum order. The data in the respective stages are shifted to the next stages by a clock signal from a line 61. Numerals 40-44 denote exclusive OR gates (EOR gates).

Such dividers are well known.

In order for the FSRG to be a divider having $G(x)$ as a divisor, an EOR gate is provided between each register having the reference numeral which is one larger than the order of each term of $G(x)$ (23, 21, 11, 2, 0 in the formula (14)) and the preceding stage, and an output terminal of the EOR 40 is connected to another input terminal of each EOR.

When the transmitted data $D(x)$ is sequentially supplied to the FSRG from $a_s$ to $a_o$, the content in the stages 1-32 is the check pattern $R(x)$.

Then, a switch 50 is connected to ground to start shifting the take out $R(x)$ from the stage 32. It is transmitted following the transmission bit data. In this manner, the code word $F(x)$ of the Fire code is generated.

(2) Method of Decoding the Fire code

A receiving station receives the input code word $F^*(x) \cdot F^*(x)$ is divided by the generator polynomial. It must be divisible without a residue if no error is included in $F^*(x)$. (The transmitted code word $F(x)$ of the Fire code is divisible by $G(x)$ without a residue.) However, if $F^*(x)$ includes a burst error $B(x)$ starting from a $(j+1)$th bit, $F^*(x)$ is not divisible by $G(x)$. $F^*(x)$ under this condition is represented by $$F^*(x) = F(x) + x^j \cdot B(x) \quad (15)$$

Figure 8:
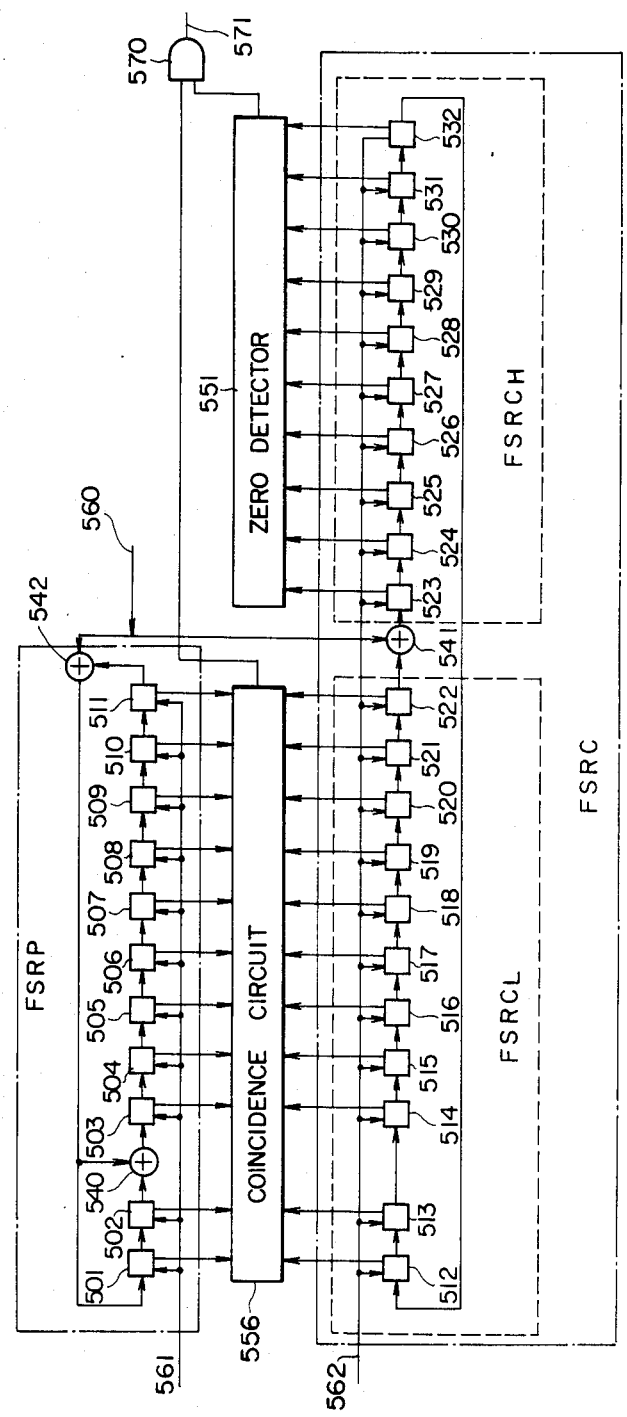
FIG. 8 shows a decoding circuit for the Fire code.

The generator polynomial $G(x)$ consists of the irreducible polynomial $P(x)$ and the polynomial $(x^c+1)$. Residues produced by dividing $F^*(x)$ by those polynomials are syndromes $R_p(x)$ and $R_c(x)$, respectively. Those syndromes are multiplied by $x^{n-j}$ and the products are divided by $P(x)$ and $(x^c+1)$, respectively. If residues thereof are equal, $(j+1)$ represents the error position and $x^{n-j} \cdot R_p(x)$ represents the burst error $B(x)$. Accordingly, the following relationships are met $$\left. \begin{array}{l} x^j \cdot B(x) \equiv R_p(x) \pmod{P(x)} \\ x^j \cdot B(x) \equiv R_c(x) \pmod{x^c + 1} \end{array} \right\} \quad (16)$$

$$\left. \begin{array}{l} x^{n-j} \cdot R_p(x) \equiv x^n \cdot B(x) \equiv B(x) \pmod{P(x)} \\ x^{n-j} \cdot R_c(x) \equiv x^n \cdot B(x) \equiv B(x) \pmod{x^c + 1} \end{array} \right\} \quad (17)$$

where $x^j \cdot B(x) \equiv R_p(x) \pmod{P(x)}$ represents that the residues divided by $P(x)$ are equal. FIG. 8 shows a decoder. FSRP denotes a divider which divides the input code word $F^*(x)$ supplied via a signal line 160 by the generator polynomial $P(x)$. FSRC denotes a divider which divides the input code $F^*(x)$ by $(x^c+1)$. A coincidence circuit 150 and a zero detector 151 detects the coincidence between the contents of the FSRC and the FSRP. When they are coincident, a signal is produced on a signal line 171.

When the input code word $F^*(x)$ has been inputted to the FSRC and FSRP, syndromes $S_c(x)$ and $S_p(x)$ therefor meet the following because the input code is inputted to the output stages of respective m-stage shift registers.

$$x^{j+m} \cdot B(x) = S_p(x) \pmod{P(x)}$$

$$x^{j+m} \cdot B(x) = S_c(x) \pmod{x^c+1}$$

In order to multiply those by $x^{n-j-m}$ to render them coincident, the shifting is effected in the FSRC and the FSRP $(n-j-m)$ times with zero input.

$$\left. \begin{array}{l} x^{n-j-m} \cdot x^{j+m} \cdot B(x) \equiv x^n \cdot B(x) \equiv B(x) \equiv x^{n-j-n} \cdot S_p(x) \\ \qquad\qquad\qquad\qquad\qquad\qquad\qquad (\bmod\ P(x)) \\ x^{n-j-m} \cdot x^{j+m} \cdot B(x) \equiv x^n \cdot B(x) \equiv B(x) \equiv x^{n-j-m} \cdot S_c(x) \\ \qquad\qquad\qquad\qquad\qquad\qquad\qquad (\bmod\ x^c+1) \end{array} \right\} \quad (18)$$

In this prior art decoding method, a maximum of $(n-m)$ times of shifting are necessary.

When such a recording method is actually used, a maximum of $(n-m)$ times of shifting are required whatever low the order of the input code $F^*(x)$ is.

For example, in a disk storage for data, one sector has 128 bytes (1024 bits) or 256 bytes (2047 bits). On the other hand, in the Fire code which uses the generator polynominal $G(x)$ is represented by the formula (14), $n=42987$ which is approximately 20-40 times as long. Even in this case, approximately 40 thousands times of shifting are required.

On the other hand, however small the code length of the input code $F^*(x)$ is, the code length n can not be reduced because the code length n of the Fire code $F(x)$ is largely related to the correctable burst error length. More specifically, when the correctable error length is given, m is determined and c is determined. On the other hand, e is determined based on m, and n is determined based on c and e. Accordingly, in order to increase the correctable error length, n must be increased.

In order to reduce the number of times of shifting, it has been proposed to use the "Chinese Remainder Therorem" (See "Burst-Correcting Code with High Speed Decoding" referenced above.) When it is applied to the decoding of the Fire code, the FSRC is shifted until FSRC$_L$ is rendered all-zero, and then the FSRP is shifted until it coincides with FSRC$_H$. The error location $(j+1)$ is determined by the number $r_c$ of times of shifting required for the FSRC, the number $r_p$ of times of shifting required for the FSRP and constant Ac and Ap, in accordance with the following formula.

$$j = Ac \cdot e^{r_c} + Ap \cdot c^{r_p} \pmod{n} \qquad (19)$$

However, this method needs a divider having a divisor n to resolve the formula (19), and hence a complex hardware.

In accordance with the present embodiment, the number of times of shifting is reduced when the length of the input code is small so that the Fire code is decoded with a small increase of the hardware.

The decoding method of the present embodiment is now explained.

In describing the present embodiment, let us assume that the input code $F^*(x)$ is represented as follows.

$$F^*(x) = b_{s+m+c-1} \cdot x^{s+m+c-1} + b_{s+m+c-2} \cdot x^{s+m+c-2} + \ldots + b_0 \qquad (20)$$

where s is a length of a data field of the input code word and $n \gg s+m+c$, and $b_{s-1} - b_0$ are input data bits.

The Fire code $F(x)$ can decode a code having a length of up to n. Accordingly, coefficients of terms $x^{n-1}$ to $x^{s+m+c}$ in the formula (20) are zero.

In order to detect the burst error from the input code word $F^*(x)$, at least $(n-s-m-c)$ times of shifting by the formula (18) are required. Since $n \gg s+m+c$, the number of times of shifting is very large. In order words, the error location j cannot be detected before such number of times of shifting. If most parts of the huge member of times of shifting can be omitted, the object of the present invention can be attained.

In the present invention, the following points were noticed.

(1) The irreducible polynomial $P(x)$ has a period e. It means that if a product of a polynomial $R_p(x)$ having a lower order than $P_i(x)$ and $x^e$ is divided by $P(x)$, a residue is equal to the polynomial $R_p(x)$. For example, in FIG. 8, the content of the divider FSRP returns to the original one after e times of shifting.

(2) When the Fire code $F(x)$ is divided into e-bit blocks, the input code word $F^*(x)$ appears in the latter half blocks.

(3) The polynomial $(x^c+1)$ also has a period c. For example, the contents of the dividers FSRC and FSRP of FIG. 8 returns to the original ones after c times of shifting.

(4) The polynomial $P(x)$ and the polynomial $(x^c+1)$ have different periods from each other. When the polynomials $R_p(x)$ and $R_c(x)$ are multiplied by $x^e$ and the products are divided by $P(x)$ and $(x^c+1)$, respectively. The residue produced when divided by $P(x)$ is equal to $R_p(x)$ but the residue produced when divided by $(x^c+1)$ is $$x^e \cdot R_c(x) = x^{e-\beta c} \cdot R_c(x) \pmod{x^c+1}$$

where $\beta$ is a maximum integer which meets $e \geq \beta c$.

The value of $\beta$ can be calculated, then $e-\beta c$ is determined, and $R_c(x)$ is multiplied by $x^{3-\beta c}$ and the product is divided by $(x^3+1)$. This is equivalent to multiplying $R_p(x)$ and $R_c(x)$ by $x^e$ and dividing the products by $P(x)$ and $(x^c+1)$, respectively.

For example, when $(e-\beta c)$ is determined and the FSRC is shifted $(e-\beta c)$ times, it is equivalent to shifting the FSRC and the FSRP e times.

(5) The order $(s+m+c)$ of the input code $F^*(x)$ is much smaller than the code length n.

Figure 9:
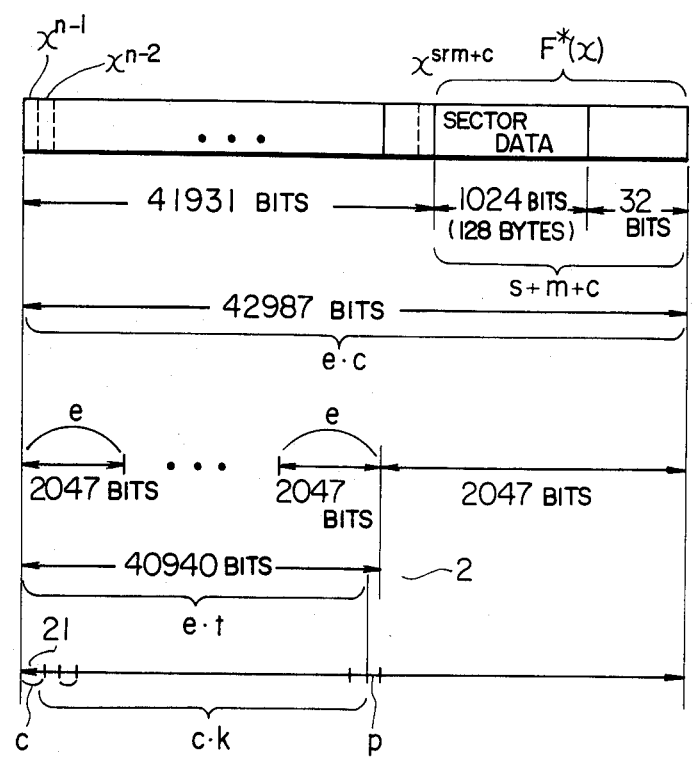
FIG. 9 shows a format of the Fire code.

As shown in FIG. 9, at least $(n-s-m-c)$ times of division are required before the error location is detected. The period e is cycled t times during this period. The value of t can be obtained by calculation. On the other hand, $R_c(x)$ is multiplied by $x^{et}$ and the product is divided by $(x^c+1)$. The residue produced is a quotient of a product of $R_c(x)$ and $x^p$, divided by $(x^c+1)$. Namely, the period c of $(x^c+1)$ is cycled k times during $(e \cdot t)$ cycles. A difference between $e \cdot t$ and $c \cdot k$ is P. The value of P can be determined by calculation. Accordingly, P is first determined, $R_c(x)$ is multiplied by $x^p$ and the product is divided by $(x^c+1)$. This is equivalent to multiplying $R_p(x)$ and $R_c(x)$ by $x^{et}$ and dividing the products by $P(x)$ and $(x^c+1)$, respectively.

For example, when the FSRC is shifted P times, it is equivalent to shifting the FSRP and the FSRC $e \cdot t$ times.

(6) Those are sequentially multiplied by x and the products are divided by $P(x)$ and $(x^c+1)$, respectively. The error location is detected by the number j of multiplication by x when the residues of both divisions are equal.

The above operations will be represented by formulas.

The syndromes $R_p(x)$ and $R_c(x)$ are first determined.

$R_p(x) \equiv F^*(x) \pmod{P(x)}$ $R_c(x) \equiv F^*(x) \pmod{x^c+1}$

Then, $R_c(x)$ is multiplied by $x^p$ and the product is divided by $(x^c+1)$.

$R_p(x) \equiv x^{e \cdot i} \cdot R_p(x) \equiv F^*(x) \pmod{P(x)}$ $x^p R_c(x) \equiv x^{e \cdot i} \cdot R_c(x) \equiv x^{ck+p} \cdot R_c(x) \pmod{x^c+1}$ Finally, those are multiplied by $x^j$, respectively.

$B_p(x) \equiv x^j \cdot R_p(x) \equiv x^j \cdot F^*(x) \pmod{P(x)}$ $B_c(x) \equiv x^{p+i} \cdot R_c(x) \equiv x^{p+i} \cdot F^*(x) \pmod{x^c+1}$ The integer j when $B_p(x)$ and $B_c(x)$ are equal represents the error location. The $B_p(x)$ at this time represents the burst error B(x) pattern.

In summary, the integer j can be determined from $B_p(x) = x^j \cdot F^*(x) \pmod{P(x)}$ $B_c(x) = x^{p+j} \cdot F^*(x) \pmod{x^c+1}$ $B_p(x) = B_c(x) = B(x)$ The construction of the present embodiment will now be explained with reference to the drawings. Let us assume the Fire code whose generator polynomial G(x) is represented by the formula (14). The code length n is given by $$n = 21 \times (2^{11} - 1) = 42987 \quad (21)$$

The length of the check pattern R(x) is 32 bits. One burst error having a length of up to b=11 bits is correctable ($b \leq m$).

Figure 10:
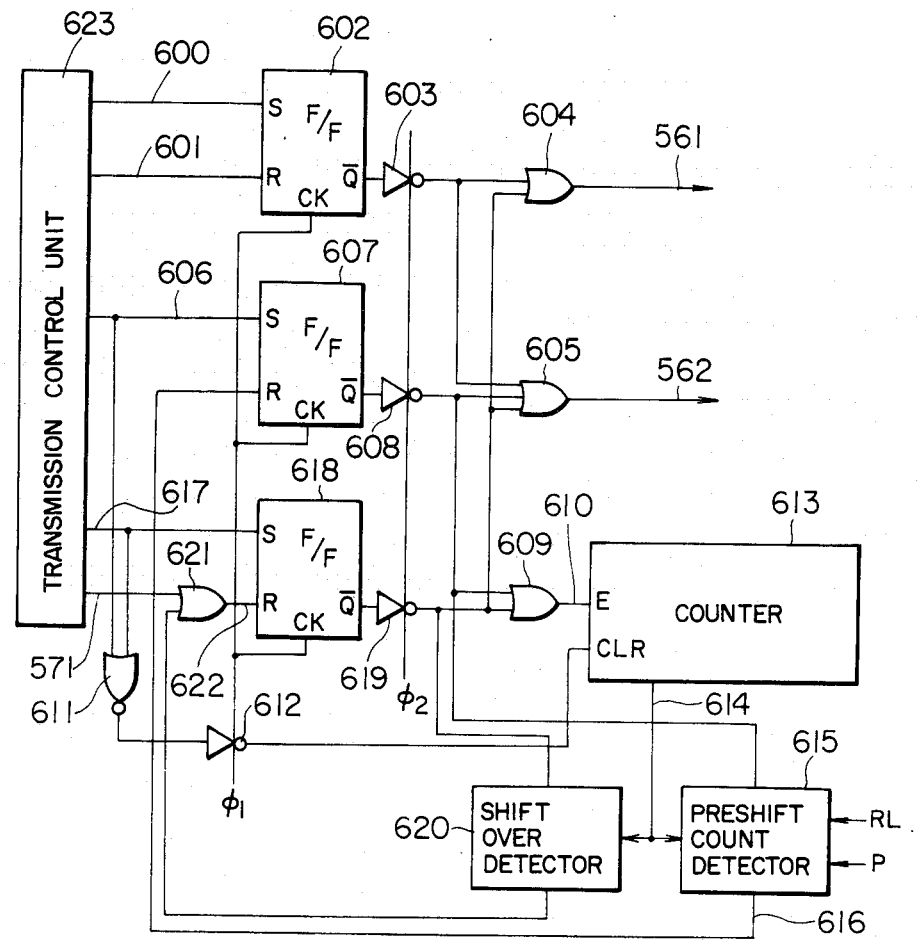
FIG. 10 shows a control circuit.

FIGS. 8 and 10 show a decoder for the Fire code represented by the formula (14) and a control circuit therefore. Stages 501–511 and an exclusive OR gate 540 constitute the divider FSRP having the polynomial $(x^{11}+x^2+1)$ as a divisor. Stages 512–532 constitute the divider (feedback shift register FSRC) having the polynomial $(x^{21}+1)$ as a divisor. The stages 512–522 are called $FSRC_L$ and the stages 523–532 are called $FSRC_H$. A coincidence circuit 550 checks the coincidence between the bits of the FSRP and the $FSRC_L$, that is, the stages 501 and 512, 502 and 513, 503 and 514, 504 and 515, 505 and 516, 506 and 517, 507 and 518, 508 and 519, 509 and 520, 510 and 521, and 511 and 522. A zero detector 551 checks whether all of the stages 523–532 are zero. An AND gate 570 renders a signal line 571 high level when both the coincidence circuit 550 and the zero detector 551 are high level. When a signal line 561 changes to high level, the FSRP is shifted, and when a signal line 562 changes to high level, the FSRC ($FSRC_H$ and $FSRC_L$) is shifted.

The decoding operation will now be explained. The decoding is done by the following three steps.

Figure 11:
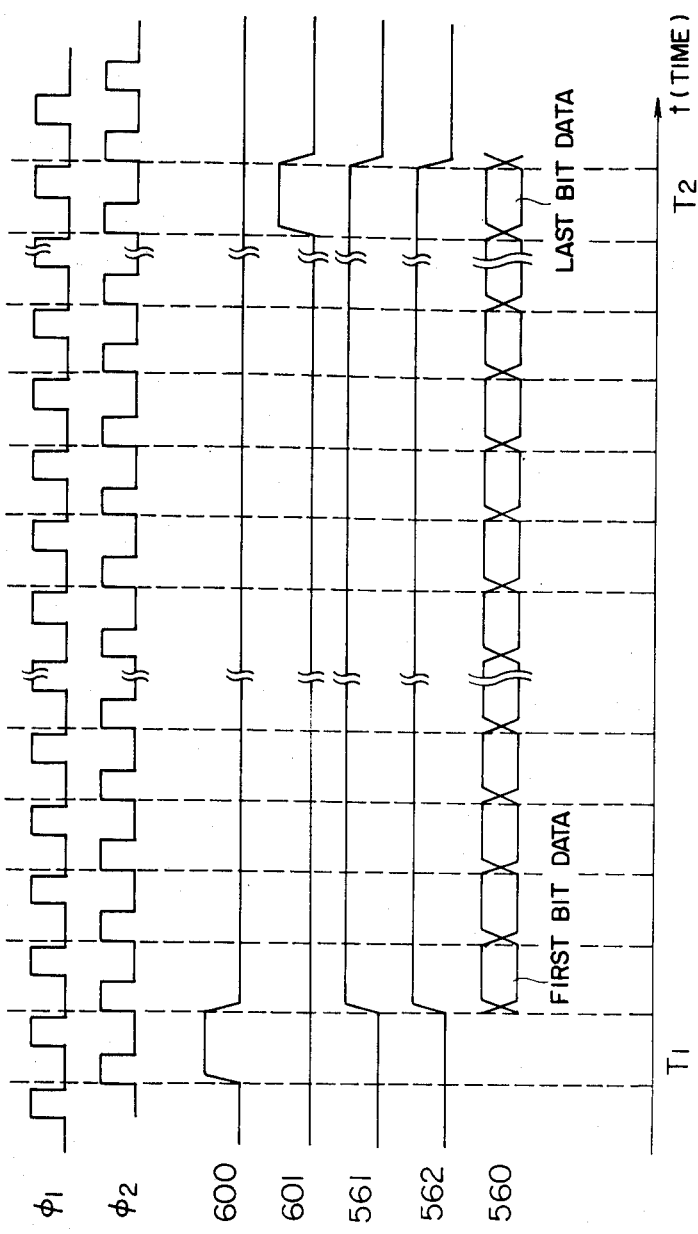
FIGS. 11 and 12 show timing charts.
Figure 12:
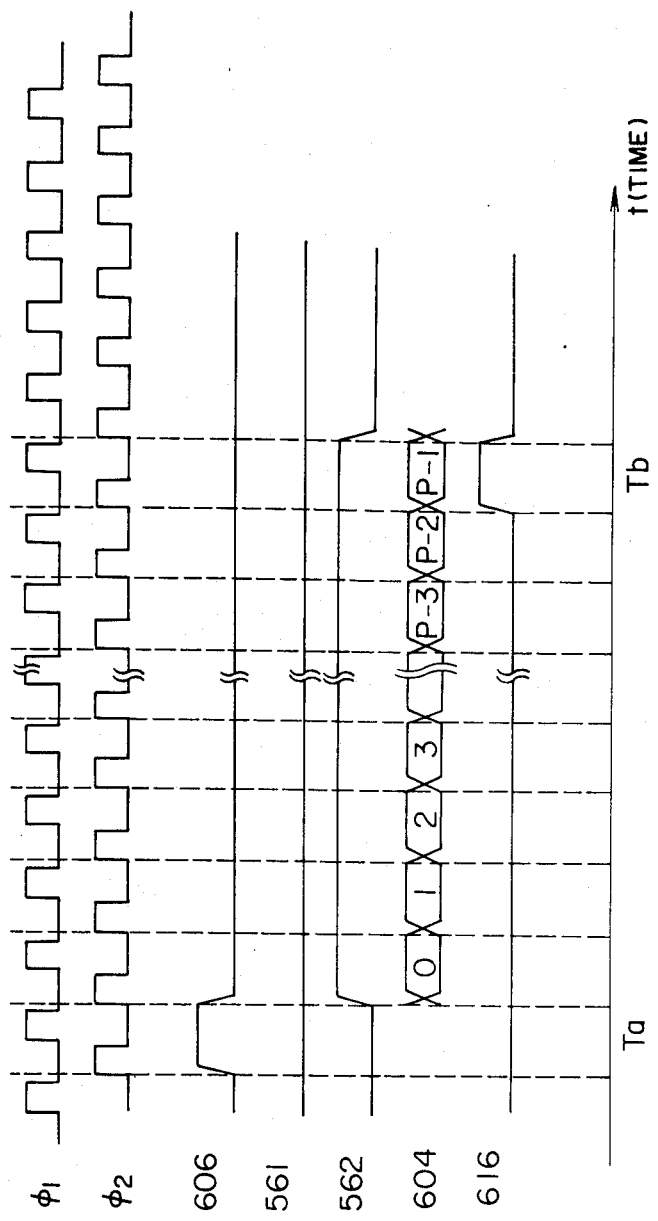

(S1) Generation of syndromes $S_c(x)$ and $S_p(x)$
(S2) Preshifting of FSRC by P times (S3) Determination of error pattern B(x) and error location j A circuit shown in FIG. 10 controls the above three steps, and FIGS. 11, 12 and 14 show timing charts for the processes in the steps (S1), (S2) and (S3), respectively. The processes in the steps (S1), (S2) and (S3) are now explained.

The step (S1)-generation of syndromes is first explained. In FIG. 8, the input data 560 is supplied to the FSRP and FSRC through the exclusive OR gates 541 and 542, respectively. A set of contents of the FSRP and FSRC at the end of the inputting of the data is the syndrome for the Fire code.

Shift enable signals 561 and 562 are generated by the circuit of FIG. 10 and the timing thereof is shown in the timing chart of FIG. 11. Referring to FIGS. 10 and 11, a signal line 600 from a transmission control unit 623 for controlling the signal reception is rendered high level in synchronism with a clock $\phi_2$ at a timing $T_1$ one clock before the first bit data of the input data 560 ($F^*(x)$) is supplied to the decoder. The signal line 600 renders a Q-output of a flip-flop 602 low level, and the $\overline{Q}$-output is sent to signal lines 561 and 562 through a clock gate 603 which receives a clock input $\phi_2$ and OR gates 604 and 605. Accordingly, the signal lines 561 and 562 are rendered high level in synchronism with the first bit data of the input data 560. A signal line 601 indicates the end of the input data. It is rendered high level at the timing $T_2$ in synchronism with the last big data of the input data 560. The signal line 601 renders the $\overline{Q}$-output of the flip-flop 602 high level and renders the signal lines 561 and 562 low level through the clocked gate 603 and the OR gates 604 and 605. As shown in FIG. 11, when the syndromes $S_p(x)$ and $S_c(x)$ are generated, the signal lines 561 and 562 are rendered high level only for the period of data input. The set of contents of the dividers FSRP and FSRC at the end of inputting of the last bit of the input data are the syndromes $S_p(x)$ and $S_c(x)$. In FIGS. 10, 11, 12 and 14, $\phi_1$ and $\phi_2$ represent non-overlapping two-phase clocks.

The steps (S2)—preshifting will now be explained. In this step, shifting is effected only in the FSRC by P times. Calculation method for P will be explained later. The preshifting serves to substantially reduce the number of times of shifting when the length of the input code word $F^*(x)$ is short, such as the disk data.

A preshift start signal 606 renders the $\overline{Q}$-output of the flip-flop 607 low level at a timing $T_a$ of FIG. 6 and renders the signal lines 562 and 610 high level through a clocked gate 608 which receives the clock input $\phi_2$ and OR gates 605 and 609. The high level on the signal line 562 permits the shifting of the FSRC and the high level on the signal line 610 permits the incrementing of the counter. The preshift start signal 606 is supplied to a clear terminal of the counter 613 through a NOR gate 611 and a clocked gate 612 which receives the clock input $\phi_1$. As a result, an output 614 from the counter 613 is set to "0" in synchronism with the clock following the preshift start signal 606. A record length RL and a calculated number P of times of preshifting are supplied to a preshift count detector 615, which renders the signal line 616 high level and resets the flip-flop 607 when the output of the clocked gate 608 is high level and the output 614 of the counter 613 is (P−1) (at a timing $T_b$). As shown in FIG. 12, the signal line 662 is rendered high level only for the durations of the P clocks so that the shifting is effected P times in the FSRC.

The number P of times of preshifting will now be explained. In the generator polynomial shown by formula (14), the polynomial $(x^{11}+x^2+1)$ is a primitive polynomial and the period e of the FSRP is 2047 $(=2^{11}-1)$. The FSRC represented by the polynomial $(x^{21}+1)$ is a simple rotation and the period thereof is 21. The patterns of the FSRP and FSRC return to their original ones after 2047 and 21 times of shiftings, respectively. Accordingly, if the shifting is omitted by a number of times equal to a multiple of 2047, no shifting is required for the FSRP and a maximum of 20 times of shifting is required for the FSRC depending on the number of times of shifting omitted. The number of times of preshifting is P.

In the disk data, the record length RL is 128, 256 , .. . bytes. For the Fire code whose generator polynomial is shown by the formula (14), the number P of times of preshifting is explained with reference to FIG. 9.

Since the sector data has 1024 bits and the length of the check pattern R(x) is 32 bits, the leading 41931 bits of the 42987-bit Fire code may be considered all-zero. Especially, $2047 \times 20 = 40940$ bits of the 41931 bit may be considered all-zero. In this case, the number P of times of preshifting is given by $$P = \left\{ \left( 21 - \left\lceil \frac{1024 + 32}{2047} \right\rceil \right) \times 2047 \right\} \pmod{21} \quad (22)$$

$$= 11 \ .$$

where $\lceil a \rceil$ represents a round-up number of a.

The number of times of shifting omitted is e·t, where $$t = \left( 21 - \left\lceil \frac{1024 + 32}{2047} \right\rceil \right)$$

The number P of times of preshifting in the FSRC is formalized. Assuming that the record length of the disk data is RL bytes, $(RL \times 8 + 32)$-bit data, including the 32-bit Fire code check pattern, is recorded on the disk. Accordingly, the length of the input code $F^*(x)$ is $(RL \times 8 + 32)$ and a maximum of $\{42987 - (RL \times 8 + 32)\}$ times of shifting can be omitted. If $$\left( 21 - \left\lceil \frac{RL \times 8 + 32}{2047} \right\rceil \right) \times 2047 \quad (23)$$

leading bits are considered all-zero, the number P of times of preshifting in the FSRC is represented by $$P = \left\{ \left( 21 - \left\lceil \frac{RL \times 8 + 32}{2047} \right\rceil \right) \times 2047 \right\} \pmod{21} \quad (24)$$

$$P = \left\{ \left( c - \left\lceil \frac{s + m + c}{e} \right\rceil \right) \times e \right\} \pmod{c}$$

FIG. 13 shows an example of calculation of RL and P.

The final step (S3) will now be explained. This step determines the error pattern B(x) and the error location j. In FIG. 10, the error detection start signal 617 renders the $\overline{Q}$-output of the flip-flop 618 low level at a timing $t_1$ (FIG. 6) and renders the signal lines 561, 562 and 610 high level through the clocked gate 619 which receives the clock input $\phi_2$ and the OR gates 604, 605 and 609. At the same time, the error detection start signal 617 clears the counter 613 through the NOR gate 611 and the clocked gate 612. As shown in FIG. 14, the signal lines 561 and 562 are rendered high level at the clock $\phi_2$ following the error detection start signal 617 to start the shiftings in the FSRP and FSRC, and the output 614 of the counter 613 is incremented from "0".

The shiftings in the FSRC and FSRP are effected until any of the following conditions is met.

(C1) The bits of the FSRP and the bits of the $FSRC_L$ are coincident and the bits of the $FSRC_H$ are all-zero.

(C2) The number of times of shifting exceeds a predetermined number Q.

When the condition (C1) is met, the signal line 571 in FIG. 8 is asserted, and the error pattern is represented by the bits of the FSRC and the error location is at 40940+number j of times shifting from the leading position. The condition (C2) is detected by a shift over detector 620 of FIG. 9 by the output of the clocked gate 619 and the counter output 614. The number Q may be a number larger than $(RL \times 8 + 32)$. When it is a multiple of 4098, the detector may be simplified. FIG. 15 shows an example of calculation of Q. The condition (C2) indicates the occurrence of a uncorrectable error.

When the condition (C1) or (C2) is detected, the signal line 622 in FIG. 9 is rendered high level through the OR gate 621 and the flip-flop 618 is reset at a timing $t_2$. As shown in FIG. 14, when the error detection start signal 617 is rendered high level, the signal lines 561 and 562 are rendered high level at the next clock $\phi_2$ and the counter output 614 is incremented from "0". When the condition (C1) or (C2) is thereafter detected, the signal line 622 is rendered high level and the signal lines 561 and 562 are negated. The incrementing of the counter is stopped.

The steps (S1), (S2) and (S3) described above are the decoding method for the Fire code in the present invention.

Assuming that the Fire code whose generator polynominal is represented by the formula (14) and the record length RL is 128 bytes, the prior art method required a maximum of (42987−11) times of shifting while the present method requires only (2048+11) times of shifting. Assuming that one shift cycle requires 100 ns (10 MHz), the prior art method needs approximately 4.3 seconds while the present method needs only 0.2 second. The advantage from a practical point of view is great.

When the "high speed decoding method based on the Chinese Remainder Theorem" is used, the division by an integer n shown by the formula (15) is necessary. In the Fire code which uses the generation polynominal G(x) shown by the formula (14), n=42987 and 17-bit division is required. Accordingly, it is not appropriate for an 8/16-bit microcomputer. The present invention requires no such division.

In the above embodiment, after the P times of preshifting, the FSRP and the FSRC are shifted until their contents coincide. Alternatively, the FSRC and FSRP may be synchronously shifted q' times before or after the P times of preshifting, where $$q' = (c-p) \cdot e - (s+m+c)$$

and then they may be synchronously shifted until the contents thereof coincide.

In the above embodiment, the FSRC is preshifted. Alternatively, the FSRP may be preshifted. In this case, the number P' of times of preshifting is given by $$P' = \left\{ \left( \left( e - \left\lceil \frac{s+m+c}{c} \right\rceil \right) \times c \right) \right\} \pmod{e}$$

While particular embodiments of the invention has been shown and described, it will be obvious to those skilled in the art that various changes and modifications may be made without departing from the present invention in its broader aspect.

What is claimed is:

1. In an apparatus for decoding a cyclic code generated by a generator polynomial $$G(x) = (x^c + 1) \prod_{i=1}^{l} P_i(x)$$

(where $P_i(x)$ is a $m_i$-order irreducible polynomial) including 0-th to l-th feedback shift registers corresponding to the terms $(x^c+1)$ and $P_i(x)$, an error detecting circuit for detecting coincidence of a predetermined number of low order bits of said 0-th to l-th feedback shift registers and for detecting an all-zero condition of the high order bits of said 0-th to l-th feedback shift registers, said predetermined number being a minimum one of the numbers of bits (c, $m_1$, $m_2$, . . . $m_l$) of said feedback shift registers, said 0-th feedback shift register having an output terminal thereof connected to an input terminal thereof, and said 1st to l-th feedback shift registers each having an output terminal thereof connected to an input terminal thereof and having exclusive OR gates inserted between stages determined by the associated irreducible polynomial, said exclusive OR gates each receiving the output of the associated feedback shift register as one input thereto and said 0-th to l-th feedback shift registers having data input terminals at the b-th stage, where b is the minimum numbers of bits (c, $m_1$, $m_2$, . . . $m_l$) of said feedback shift registers; a method for decoding said cyclic code for correcting a single burst error by shifting said 0-th to l-th feedback shift registers until said error detecting circuit detects the coincidence and all-zero condition, comprising the steps of:
shifting at least one of said 0-th to l-th feedback shift registers a predetermined number of times; and
after said predetermined number of shifting, shifting said 0-th to l-th feedback shift registers simultaneously until said error detecting circuit detects the coincidence and all zero condition.

2. An apparatus for decoding a cyclic code generated by a generator polynomial $$G(x) = (x^c + 1) \prod_{i+1}^{l} P_i(x)$$

(where $P_i(x)$ is a $m_i$-order irreducible polynomial) comprising:
0-th to l-th feedback shift registers corresponding to the terms $(x^c+1)$ and $P_i(x)$, said 0-th feedback shift register having an output terminal thereof connected to an input terminal thereof, and said 1st to l-th feedback shift registers each having an output terminal thereof connected to an input terminal thereof and having exclusive OR gates inserted between stages determined by the associated irreducible polynomial, said exclusive OR gates each receiving the output of the associated feedback shift register as one input thereto and said 0-th to l-th feedback shift registers having data input terminals at the b-th stage, where b is the minimum numbers of bits (c, $m_1$, $m_2$, . . . $m_l$) of said feedback shift registers;
an error detecting circuit for detecting coincidence of a predetermined number of low order bits of said 0-th to l-th feedback shift registers and for detecting an all-zero condition of the high order bits of said 0-th to l-th feedback shift registers, said predetermined number being a minimum one of the numbers of bits (c, $m_1$, $m_2$, . . . $m_l$) of said feedback registers;
a first controller for shifting at least one of said 0-th to l-th feedback shift registers a predetermined number of times; and
a second controller for shifting said 0-th to l-th feedback shift registers simultaneously after said predetermined number of times of shifting by said first controller until said error detecting circuit detects the coincidence and all-zero condition.

3. An apparatus for decoding a Fire code comprising:
first and second feedback shift registers for receiving an input code, said first feedback shift register having an output terminal thereof connected to an input terminal thereof and having an exclusive OR gate inserted between stages thereof, said second feedback shift register having an output terminal thereof connected to an input terminal thereof and having an exclusive OR gate inserted between stages thereof, said exclusive OR gate receiving the output of said second feedback shift register as one input thereto;
an error detecting circuit for detecting coincidence of the lower c bits of said first and second feedback shift registers and for detecting an all-zero condition of the high (c−m) bits of said second feedback shift register;
a first controller for shifting one of said first and second feedback shift registers a predetermined number of times; and
a second controller for shifting said first and second feedback shift registers simultaneously after the shifting by said first controller until said error detecting circuit detects the coincidence and all-zero condition, whereby a burst error is detected.

4. A method for decoding a Fire code generated by a generator polynomial $G(x) = P(x) \cdot (x^c+1)$, where $P(x)$ is an m-order irreducible polynomials, and received as a received code $F^*(x)$, and for correcting a single burst error, with an apparatus including a first feedback shift register, and a second feedback shift register, said first feedback shift register having an output terminal thereof connected to an input terminal thereof and having an exclusive OR gate inserted between the stages thereof, said exclusive OR gate receiving the output of said feedback shift register as one input thereto, said second feedback shift register having an output terminal thereof connected to an input terminal thereof, and an error detecting circuit for detecting coincidence of the lower c bits of said first and second feedback shift registers and for detecting all-zero condition of high (c−m) bits of said second feedback shift registers, said method comprising the steps of:

inputting the received code $F^*(x)$ in said first feedback shift register, whereby a residue obtained by dividing $F^*(x)$ by $P(x)$ is retained in said first feedback shift register when the code $F^*(x)$ has been inputted therein, and inputting the received code $F^*(x)$ in said second feedback shift register, whereby a residue obtained by dividing $F^*(x)$ by $(x^c+1)$ is remained in said second feedback shift register when the code $F^*(x)$ has been inputted therein;

shifting said first feedback shift register by $\gamma$ times and shifting said second feedback register by $\omega$ times, respectively, where $\gamma$ and $\omega$ are integers $\omega - \gamma = e \cdot t - c \cdot k$ $e \cdot t \leq e \cdot c - g$ $c \cdot k \leq e \cdot c - g$ $t = 0, 1, \ldots, c$ $k = 0, 1, \ldots, e$ t and k are not simultaneously zero
e is the period of $P(x)$
g is the length of the input code $F^*(x)$; and
shifting said first and second feedback shift registers simultaneously until said error detecting circuit detects the coincidence and all-zero conditions, wherein the number of times of shifting j shows an error location information.

5. A method for decoding a Fire code according to claim 4 wherein $$\omega = \left\{ \left( c - \left\lceil \frac{g}{e} \right\rceil \right) \cdot e \right\} \quad (\bmod\ c)$$

6. A method for decoding a Fire code according to claim 4 wherein $$\gamma = (c - p) \cdot e - g \quad (\bmod\ c)$$

$$p = \left\{ \left( c - \left\lceil \frac{g}{e} \right\rceil \right) \cdot e \right\}$$

$$\omega = (p + \gamma).$$

7. A method for decoding a Fire code according to claim 4, further comprising the steps of:

(a) generating residue polynomials $R_p(x)$ and $R_c(x)$ by multiplying residues produced when an input code $F^*(x)$ to be decoded is divided by $P(x)$ and $(x^c+1)$, respectively, by multiplier $x^j$; and (b) selecting an integer j which renders the polynomials $R_p(x)$ and $R_c(x)$ equal, as error location information:

$R_p(x) = x^{\gamma + j} \cdot F^*(x) (\bmod\ P(x))$ $R_c(x) = x^{\omega + j} \cdot F^*(x) (\bmod\ x^c + 1).$

* * * * *